United States Patent
Oyama

[11] Patent Number: 5,880,499
[45] Date of Patent: Mar. 9, 1999

[54] MEMORY CELL OF A NONVOLATILE SEMICONDUCTOR DEVICE

[75] Inventor: Ken-Ichi Oyama, Tokyo, Japan

[73] Assignee: NEC Corporation, Tokyo, Japan

[21] Appl. No.: 919,681

[22] Filed: Aug. 28, 1997

Related U.S. Application Data

[63] Continuation of Ser. No. 887,408, Jul. 2, 1997, and Ser. No. 556,078, Nov. 13, 1995, abandoned.

[30] Foreign Application Priority Data

Nov. 11, 1994 [JP] Japan .................................. 6-277455

[51] Int. Cl.$^6$ ........................ H01L 29/788; H01L 29/06
[52] U.S. Cl. ........................ 257/316; 257/315; 257/317; 257/319; 257/623; 365/185.14; 365/185.26; 438/258; 438/259
[58] Field of Search .................................... 257/315, 317, 257/618, 623, 316, 319; 438/258, 259; 365/185.14, 185.26

[56] References Cited

U.S. PATENT DOCUMENTS

| | | | |
|---|---|---|---|
| 5,019,527 | 5/1991 | Ohshima et al. | |
| 5,094,515 | 3/1992 | Tzeng | 438/259 |
| 5,297,082 | 3/1994 | Lee | 365/185 |
| 5,382,534 | 1/1995 | Sheu et al. | 438/302 |
| 5,445,981 | 8/1995 | Lee | |
| 5,495,441 | 2/1996 | Hong | 365/185.01 |

FOREIGN PATENT DOCUMENTS 4233278  8/1992  Japan .

*Primary Examiner*—Valencia Martin-Wallace
*Assistant Examiner*—George C. Eckert, II

[57] ABSTRACT

A non-volatile semiconductor memory device formed on a semiconductor substrate of a first conductivity type. The semiconductor memory including a plurality of recessed portions formed on a surface of the semiconductor substrate. The recessed portions having a sidewall and a bottom at which the semiconductor substrate is exposed. A gate oxide film is also directly formed on a surface of the semiconductor substrate other than the recessed portions. A floating gate electrode is formed on the gate oxide film. A source region and a drain region of a second conductivity type is formed in the semiconductor substrate at the bottom of the recessed portion and on opposing sides of the floating gate electrode. An intergate insulation film is formed on the semiconductor substrate to cover a top surface and sidewalls of the floating gate electrode, a sidewall of the recessed portion, the source region and drain region. A control gate electrode is further formed on the intergate insulation film. The intergate insulation film is in direct contact with the sidewall of the recessed portion so that the sidewall of the semiconductor substrate adjacent to the intergate insulation film forms a channel region of a field effect transistor.

4 Claims, 6 Drawing Sheets

AS I/I

MEMORY CELL OF A NONVOLATILE SEMICONDUCTOR DEVICE

This is a continuation of application Ser. No. 08/887,408, filed Jul. 2, 1997 and Ser. No. 08/556,078, which was filed on Nov. 13, 1995 and now abandoned.

BACKGROUND OF THE INVENTION

1. Field of the Invention

The present invention relates to a nonvolatile semiconductor memory device, and particularly to a method of forming a virtual-ground split-gate erasable programmable read only memory (EPROM) cell.

2. Description of the Related Art

Virtual-ground split-gate EPROM cells have been proposed as a means for improving the packing density and yield of EPROM of the prior art. These virtual-ground split-gate EPROM cells offer two important advantages in that they employ buried $N^+$ bit lines and provide a series select transistor associated with each floating gate. The use of buried $N^+$ bit lines greatly reduces the number of contacts needed in the memory array and directly improves packing density and yield. In addition, by providing a series select transistor associated with each floating gate, voltage arising in the bit line voltage is impressed to floating gates of nonselected memory cells connected to selected bit lines, thereby insuring that nonselected memory cells are not inadvertently turned on and greatly relieving constraints on drain write voltage.

This type of memory cell has conventionally been formed by the memory cell fabrication process shown in FIG. 1. Photoresist mask pattern 3, which defines the position of a buried $N^+$ diffused layer, is first formed on silicon substrate 1, and ion injection of impurities is then carried out to form a buried $N^+$ diffused layer by means of this mask pattern 3 (Refer to FIG. 1A). After removal of the photoresist, polysilicon film 5 for floating gate use stacked over gate oxidation film 4 is next processed into gate form by dry etching employing photoresist mask pattern 6 (Refer to FIG. 1B). After successively forming intergate insulation film 8 and an overlying polysilicon film 7, polysilicon film 7 is formed for control gate use over the surface of the element (Refer to FIG. 1C). Following these processes, nonvolatile memory elements are produced by carrying out subsequent steps such as normal wiring processes.

This virtual-ground split-gate EPROM has the several drawbacks. First, because the channel length of a series select transistor is defined by the masking of the buried $N^+$ diffused layer, the electrical characteristics of a series select transistor are greatly affected by the alignment of the $N^+$ diffused layer with respect to the floating polysilicon gate. Second, the cell characteristics are further affected by variations in the series resistance of the buried bit line originating in misalignment of the final position of the buried $N^+$ diffused layer region. Third, the overall packing density tends to be reduced by the requirement to design a diffused layer of greater width than the necessary minimum width in order to ensure a diffused layer width that sufficiently lowers resistance of the buried $N^+$ bit lines despite misalignment of this diffused layer.

To solve these problems, the method of forming a memory cell shown in FIG. 2 has been proposed in Japanese Patent Laid-open No. 233278/92 (Martin H. Manley, National Semiconductor Corporation). First, a polysilicon film for use as a floating gate is stacked on gate oxide film 4 overlying silicon substrate 1 and processed to gate form. Intergate insulation film 8 and a superposed polysilicon film are next successively formed, following which polysilicon side walls 9 are formed by a silicon film etch-back technique on the side walls of floating gate 5. Photoresist 10 is patterned so as to cover polysilicon side walls 9 on only the source side of the memory cell (Refer to FIG. 2A). Next, this photoresist 10 is used as a mask to remove the polysilicon side walls 9 on only the memory cell drain side, and after removing the photoresist 10, impurities are injected to form buried diffused layer 2 (Refer to FIG. 2B). Finally, a polysilicon film 7 for control gate use is formed on the element surface which is electrically connected with polysilicon side walls 9. A nonvolatile memory element can then be produced by carrying out subsequent steps such as normal wiring processes.

In this memory cell, the buried diffused layer 2 is self-aligned using floating gates 5 and polysilicon side walls 9 as a mask, thereby solving the previously described drawbacks, i.e., (1) variation in the electrical characteristics of series select transistors due to variation in channel length of the series select transistors; (2) variation in the series resistance of the buried bit lines; and (3) increase in the width of the diffused layer in order to lower resistance of the buried $N^+$ bit lines.

However, photoresist mask 10, which is used in the process of removing only polysilicon side walls 9 on the memory cell drain side, must be formed so as to cover polysilicon side walls 9 on only the memory cell source side and not cover polysilicon side walls 9 on the drain side. As a result, the space between memory elements, i.e., the width of the buried $N^+$ diffused layer, must be drawn wide enough to compensate for misalignment of photoresist mask 10. Therefore, due to this difficulty of reducing the spacing between elements, high packing density is difficult to achieve despite miniaturization of the memory elements themselves.

In addition, channel length of the series select transistors is also difficult to control because the residual amount of polysilicon side walls 9 on the memory cell source side, which defines the channel length, varies depending on the conditions of etch-back of the polysilicon film.

Furthermore, because the impurities in the buried $N^+$ diffused layer are spread by thermal diffusion in heat treatments following formation of the layer, a small residual amount of the above-described polysilicon side walls 9 may cause extension of the source diffused layer as far as the edge of the floating gate of the memory cell, thereby possibly preventing formation of a series select transistor. To prevent this possibility, the residual amount of polysilicon side wall 9 must be made sufficiently great, thereby limiting the packing density of the elements.

SUMMARY OF THE INVENTION

The object of the present invention is to provide a formation method of a memory cell for a nonvolatile semiconductor memory device which facilitates high packing density when the memory elements themselves are miniaturized.

According to the present invention, a method of forming a memory cell of a nonvolatile semiconductor memory device is provided wherein:

in a nonvolatile semiconductor memory device of MOSFET configuration having a source and drain formed from a diffused impurity layer buried below an element-isolation oxide film and a gate of two-layer construction that includes a floating gate and control gate;

the method of forming a memory cell from a data memory section having a two-layer gate construction and a series select transistor formed between the control gate connected to the data memory section and side walls of an exposed portion of the semiconductor substrate; the method comprising the steps of:

processing by dry etching using photoresist a polycrystalline semiconductor film forming the floating gate and an underlying gate oxide film;

forming a diffuse impurity layer by cutting into a semiconductor substrate to a prescribed depth by dry etching and exposing a side wall of the semiconductor substrate, followed by ion injection of impurities into the semiconductor substrate; and stacking and processing an intergate insulation film that forms a control gate and a polycrystalline semiconductor film.

According to the present invention, when patterning the polysilicon for use as a floating gate, the semiconductor substrate is also etched, following which ion injection is carried out to form a buried diffused layer. After forming an oxide film, a polysilicon film for use as a control gate is formed. In this case, the split portion is the side wall of the semiconductor substrate.

In this way, the diffused impurity layer of the memory cell is formed by a process of ion injection that is self-aligned with respect to the floating gates, and as a result, the dimensions of the split portion is defined only by the amount of etching. Unlike the prior art, there is no need to increase the interelement spacing, i.e., the width of the buried $N^+$ diffused layer, to compensate for misalignment of the photoresist mask used for removing the polysilicon side walls on the drain side, and as a result, the high packing density of memory elements is facilitated when memory elements themselves are miniaturized, and further, only one photoresist process is required.

In addition, the channel length of series select transistors is defined by the length in the direction of the depth of the exposed side wall portions of the silicon substrate, thus allowing tighter control of channel length. Further, channel length of series select transistors, which is defined by the length in the direction of depth of the exposed side wall portions of the silicon substrate, can be regulated independent of the amount of area taken up on the silicon substrate surface, thereby circumventing the problem usually encountered in attempting high packing density of elements. In other words, when miniaturizing memory cells, the channel length of series select transistors can be set to a sufficient length as required without causing a reduction in the packing density of elements. The present invention thus facilitates high packing density of elements.

The above and other objects, features, and advantages of the present invention will become apparent from the following description with references to the accompanying drawings which illustrate examples of the present invention.

DETAILED DESCRIPTION OF THE PREFERRED EMBODIMENTS

In the memory cells of the embodiments described hereinbelow, silicon films are employed as semiconductor films, silicon oxide films are employed as insulation films, and silicon substrates are employed as semiconductor substrates.

The method of forming a memory cell according to the first embodiment of the present invention will first be explained with reference to FIG. 3.

Figure 1A:
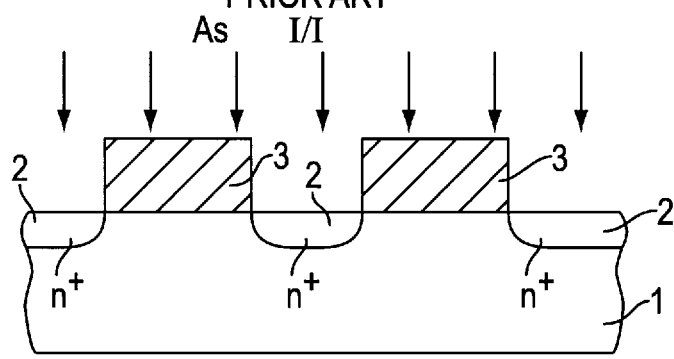
FIGS. 1A to 1C illustrate a sequence of a fabrication method of a memory cell according to the prior art.
Figure 1B:
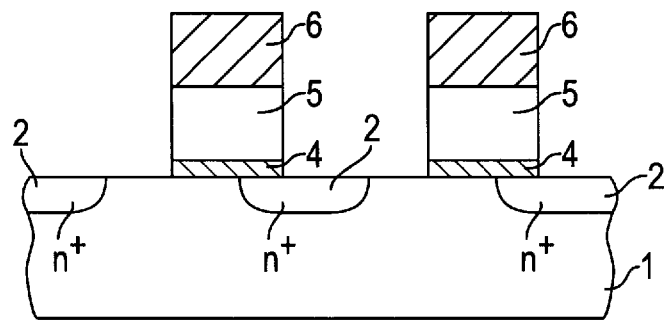
Figure 1C:
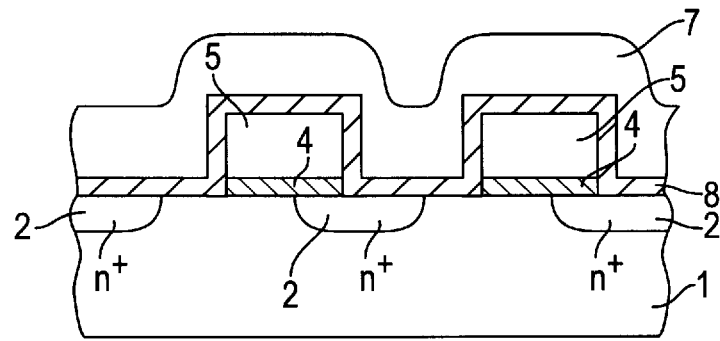
Figure 2A:
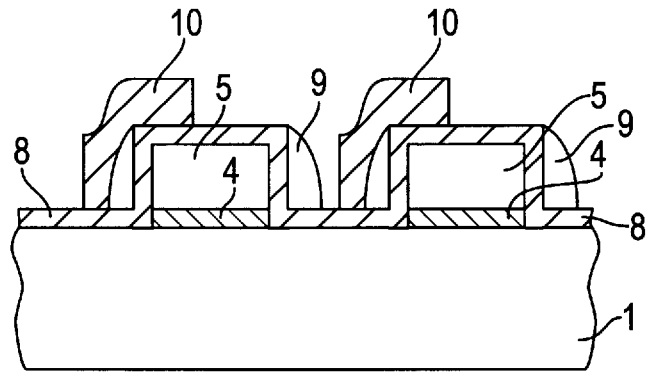
FIGS. 2A to 2C illustrate a sequence of another fabrication method of a memory cell according to the prior art.
Figure 2B:
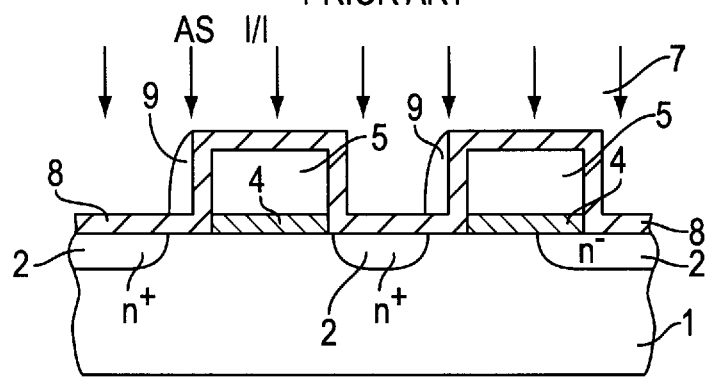
Figure 2C:
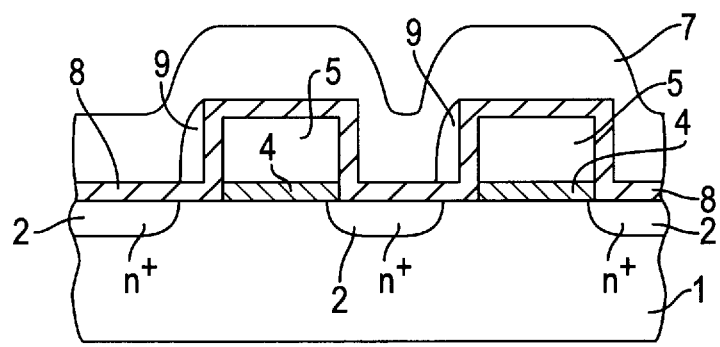
Figure 3A:
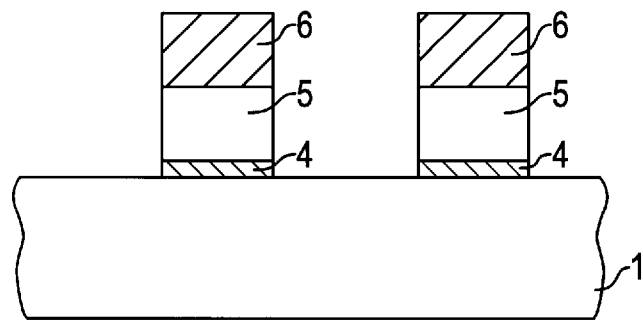
FIGS. 3A to 3C illustrate a sequence of a fabrication method of a memory cell according to the first embodiment of the present invention.
Figure 3B:
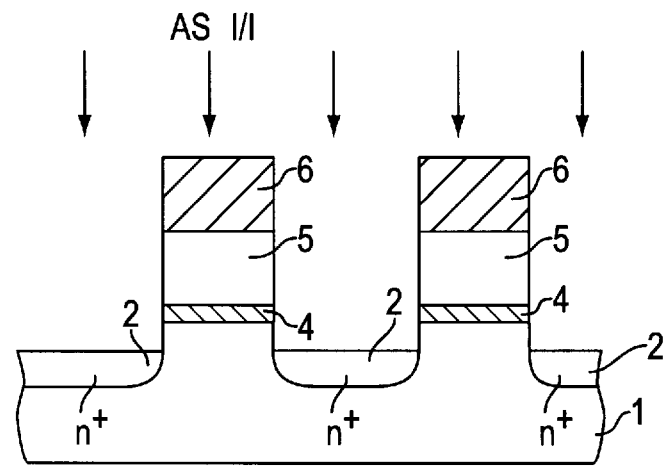
Figure 3C:
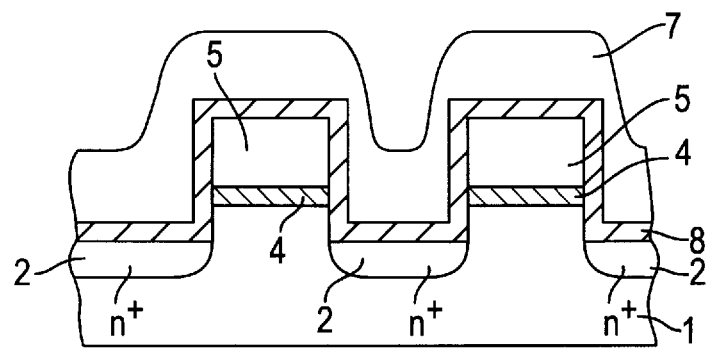

First, polysilicon film 5 for floating gate use, which is stacked on gate oxide film 4 overlying silicon substrate 1, is processed into gate form by dry etching using photoresist film 6 (Refer to FIG. 3A). Next, silicon substrate 1 is removed to a depth of exactly 0.5 $\mu$m by dry etching. After exposing side walls of silicon substrate 1, impurities are ion injected perpendicularly into silicon substrate 1, and buried diffused layer 2 is formed on silicon substrate 1 (Refer to FIG. 3B). Next, silicon oxide film 8 is formed on the surfaces of silicon substrate 1 and floating gate polysilicon 5 as an intergate insulation film, following which polysilicon film 7 for control gate use is formed on the element surface (Refer to FIG. 3C). A nonvolatile memory element can then be manufactured by carrying out subsequent processes such as normal wiring procedures.

Figure 4:
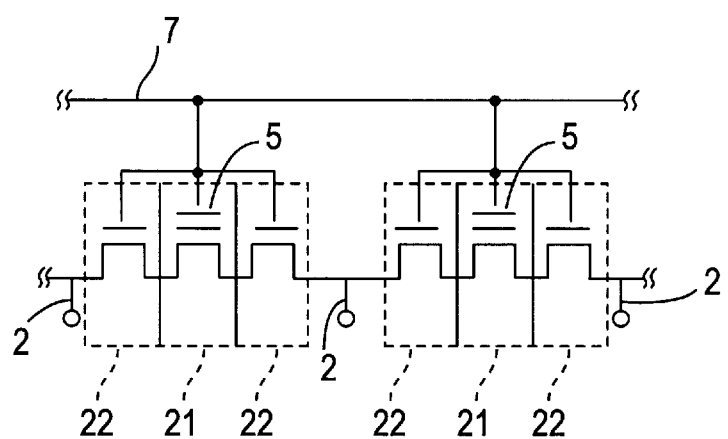
FIG. 4 is a circuit diagram of an equivalent circuit of a memory cell produced according to the first embodiment.

A schematic diagram of an equivalent circuit of a memory cell manufactured according to this fabrication method is shown in FIG. 4. Here, each memory cell is constructed from one data memory section 21 having a two-layer gate construction made up of floating gate 5 and control gate 7, and two series select transistors 22 formed by the exposed side wall portions of the silicon substrate 1 and control gates 7 positioned at both the source and drain edges. The channel length of series select transistors 22 of this memory cell is defined by the length in the direction of depth of the exposed side wall portions of silicon substrate 1.

The state of operation of this nonvolatile semiconductor memory device is as follows:

First, when writing data, high positive voltages of 12 V and 6V are impressed to control gate 7 and to the source and drain constituted by buried diffused layer 2, respectively, of a selected memory cell. As a result, the channels of the two series select transistors 22 located at the two edges of the source and drain form an electrical connection, and a channel current begins to flow to data memory section 21 having two-layer gate construction. The channel hot electrons generated by this current are injected to floating gate 5, and the threshold value voltage of data memory section 21 rises to above, for example, 5 V.

When erasing data, electrons stored in floating gate 5 of the memory cell are discharged through a step of impressing a high negative voltage of –20 V to control gate 7, or impressing a high positive voltage of 20 V to silicon substrate 1, and the threshold value voltage of data memory section 21 is lowered to below, for example, 5 V.

When reading data, positive voltages of 5 V and 1 V are impressed to control gate 7 and to the drain constituted by buried diffused layer 2, respectively, of the selected memory cell, and the source is grounded. In this state, the channels of the two series select transistors 22 located at the two edges of the source and drain form an electrical connection. However, in data memory section 21 having two-layer gate construction, the channel surface is reversed in a case in which data is not written. In other words, the channel between the drain and source of the memory cell is ON/OFF controlled, and data reading enabled, depending on the presence or absence of written data.

The method of forming a memory cell according to the second embodiment of the present invention will next be explained with reference to FIG. 5.

Figure 5A:
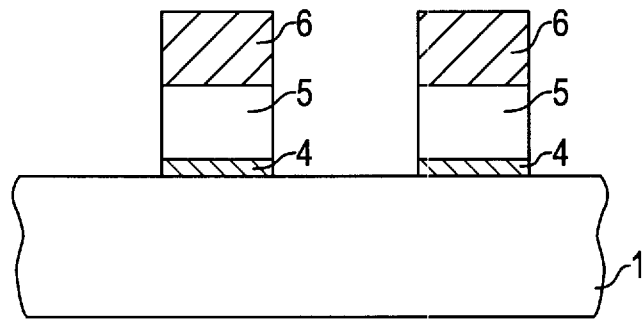
FIGS. 5A to 5C illustrate a sequence of a fabrication method of a memory cell according to the second embodiment of the present invention.
Figure 5B:
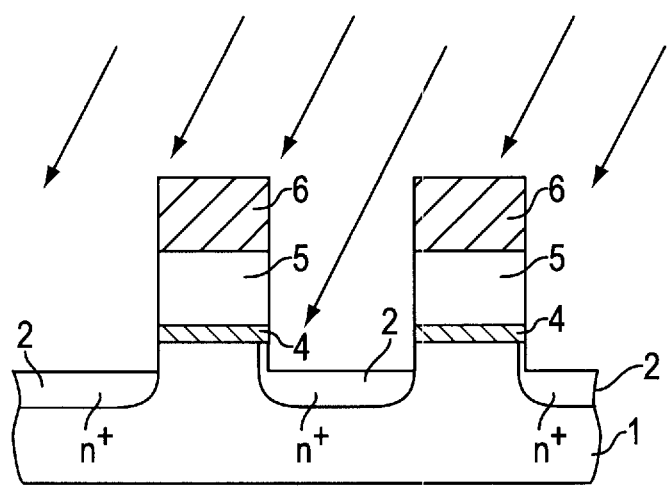
Figure 5C:
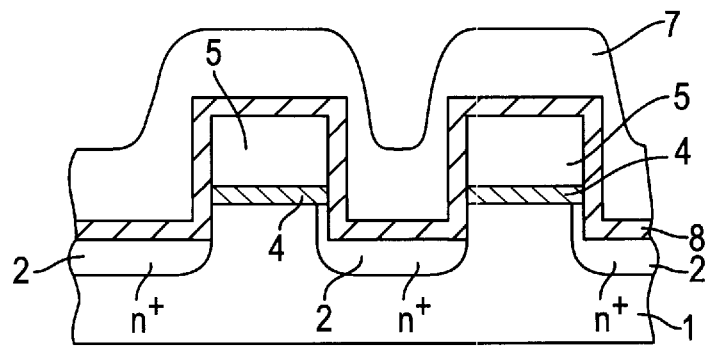

First, a polysilicon film for floating gate use, which is stacked on gate oxide film 4 overlying silicon substrate 1, is processed to gate form by a dry etching process using photoresist film 6 (Refer to FIG. 5A). Next, silicon substrate 1 is cut to a depth of exactly 0.5 $\mu$m by dry etching, thereby exposing side wall portions of silicon substrate 1. Impurities are then ion injected into silicon substrate 1 from an oblique angle to form buried diffused layer 2 in silicon substrate 1 (Refer to FIG. 5B). Next, silicon oxide film 8 is formed as an intergate insulation film on the surface of silicon substrate 1 and the surface of floating gate polysilicon 5, following which polysilicon film 7 for control gate use is formed on the element surface (Refer to FIG. 5C). A nonvolatile memory element can then be manufactured by subsequently carrying out processes such as normal wiring procedures.

Figure 6:
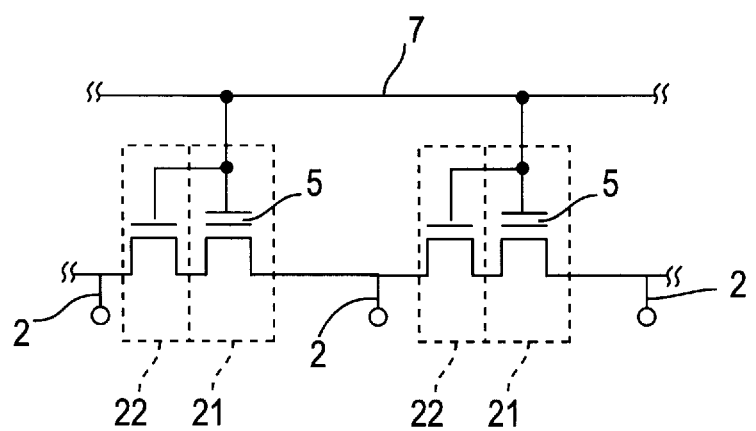
FIG. 6 is a circuit diagram of an equivalent circuit of a memory cell produced according to the second embodiment.

A schematic diagram of an equivalent circuit of a memory cell produced according to this fabrication method is shown in FIG. 6. Here, each memory cell is constructed from one data memory section 21 having two-layer gate construction made up of floating gate 5 and control gate 7, and series select transistor 22 formed by control gate 7 located at the source edge and the exposed side wall portions of the silicon substrate. The channel length of the series select transistor of this memory cell is defined by the length in the direction of death of the exposed side wall portions of silicon substrate 1.

The operating state of this nonvolatile semiconductor memory device is as follows. First, when writing data, high positive voltages of 12 V and 6 V are impressed to control gate 7 and to the source and drain constituted by buried diffused layer 2, respectively, of the selected memory cell. As a result, the channel of series select transistor 22 located at the edge of the source forms an electrical connection such that a channel current flows to data memory section 21 having two-layer gate construction. The channel hot electrons originating due to this current are injected to floating gate 5, and the threshold voltage of data memory section 21 rises to above, for example, 5 V.

When erasing data, the electrons stored at floating gate 5 of the memory cell are discharged by a step of impressing a high negative voltage of −20 V to control gate 7 or impressing a high positive voltage of 20 V to silicon substrate 1, thereby causing the threshold voltage of data memory section 21 to drop below, for example, 5 V.

When reading data, positive voltages of 5 V and 1 V are impressed to control gate 7 and to the drain constituted by buried diffused layer 2, respectively, of the selected memory cell, and the source is grounded. In this state, the channel surface of series select transistor 22 located at the edge of the source is reversed. However, the channel forms an electrical connection only if data is not written in data memory section 21 having two-layer gate construction. In other words, the channel between the drain and source of the memory cell is ON/OFF controlled, and reading of data enabled, defending on the presence or absence of written data.

In the first and second embodiments, silicon films are used as the semiconductor films, silicon oxide films are used as the insulating films, silicon substrates are used as the semiconductor substrates, and aluminum is used as the wiring material that make up the memory cells, but other types of semiconductor films, other types of insulating films, other types of semiconductor substrates, and other types of wiring materials may also be used. Furthermore, while 12 V and 6 V were used as the high positive electric potential and the low electric potential and a state in which the threshold voltage was greater than 5 V was used as the data write state, other suitable electric potentials and write states may also be employed.

While preferred embodiments of the present invention have been described using specific terms, such description is for illustrative purposes only, and it is to be understood that changes and variations may be made without departing from the spirit or scope of the following claims.

What is claimed is:

1. A non-volatile semiconductor memory device formed on a semiconductor substrate of a first conductivity type, said semiconductor memory device comprising:

a plurality of recessed portions formed on a surface of said semiconductor substrate, said recessed portions having sidewalls and a bottom at which said semiconductor substrate is exposed;

a gate oxide film directly formed on a surface of said semiconductor substrate other than said recessed portions;

a floating gate electrode formed on said gate oxide film;

a source region and a drain region of a second conductivity type each formed in said semiconductor substrate at said bottom of one of said recessed portions and on opposing sides of said floating gate electrode;

an intergate insulation film formed on said semiconductor substrate to cover a top surface and sidewalls of said floating gate electrode, said sidewalls of said recessed portions, and said source region and said drain region;

a control gate electrode formed on said intergate insulation film, wherein said intergate insulation film is in direct contact with said sidewalls of said recessed portions so that said sidewalls of said semiconductor substrate adjacent to said intergate insulation film each forms a channel region of a field effect transistor.

2. The non-volatile semiconductor memory device according to claim 1 wherein said intergate insulation film is in direct contact with one of said sidewalls of said recessed portions at a first side of said floating gate electrode and having one of said source region and drain region interposed between said intergate insulation film and said sidewall at a second side of said floating gate electrode opposing said first side, thereby selectively forming a channel region of a field effect transistor adjacent to said first side of said floating gate electrode.

3. The nonvolatile semiconductor memory device according to claim 1 wherein a memory cell is formed from a data memory section having two-layer gate construction that includes a floating gate and a control gate and two series select transistors formed at said exposed side wall portions of said semiconductor substrate, by ion injection of impurities forming a diffused impurity layer perpendicularly into said semiconductor substrate.

4. The nonvolatile semiconductor memory device according to claim 1 wherein a memory cell is formed from a data memory section having two-layer gate construction that includes a floating gate and a control gate and a series select transistor formed at said exposed side wall portions of said semiconductor substrate, by ion injection of impurities forming a diffused impurity layer into said semiconductor substrate at an oblique angle, to form said diffused layer in the surface of said side wall at only one side of said floating gate.

* * * * *